US010629757B2

(12) United States Patent
Kruse et al.

(10) Patent No.: US 10,629,757 B2
(45) Date of Patent: Apr. 21, 2020

(54) LAMINAR AIRFOIL AND THE ASSEMBLY AND MOUNTING OF SOLAR CELL ARRAYS ON SUCH AIRFOILS

(71) Applicant: SolAero Technologies Corp., Albuquerque, NM (US)

(72) Inventors: Matthew Kruse, Aliso Viejo, CA (US); Fadel Hernandez, La Mesa, CA (US)

(73) Assignee: SolAero Technologies Corp., Albuquerque, NM (US)

( * ) Notice: Subject to any disclaimer, the term of this patent is extended or adjusted under 35 U.S.C. 154(b) by 0 days.

(21) Appl. No.: 15/833,601

(22) Filed: Dec. 6, 2017

(65) Prior Publication Data

US 2019/0172955 A1    Jun. 6, 2019

(30) Foreign Application Priority Data

Dec. 5, 2017    (EP) .................................... 17205573

(51) Int. Cl.
| | | |
|---|---|---|
| *H01L 31/0203* | (2014.01) | |
| *H02S 20/30* | (2014.01) | |
| *H01L 31/18* | (2006.01) | |
| *H01L 31/042* | (2014.01) | |
| *B64D 27/02* | (2006.01) | |

(52) U.S. Cl.
CPC .......... *H01L 31/0203* (2013.01); *B64D 27/02* (2013.01); *H01L 31/042* (2013.01); *H01L 31/1804* (2013.01); *H01L 31/1876* (2013.01); *H01L 31/1892* (2013.01); *H02S 20/30* (2014.12)

(58) Field of Classification Search
CPC ... H01L 31/0203; H01L 31/30; H01L 31/042; H01L 31/048; H01L 31/0481; H01L 31/0488; H01L 31/0445; H01L 31/046; H01L 31/0475; H01L 31/1892; B64D 29/02; B64D 29/04
See application file for complete search history.

(56) References Cited

U.S. PATENT DOCUMENTS

| | | | |
|---|---|---|---|
| 5,252,141 A | 10/1993 | Inoue et al. | |
| 10,026,857 B1 * | 7/2018 | Wrosch | ............ H01L 31/03926 |
| 2009/0301544 A1 * | 12/2009 | Minelli | ................. H01L 31/048 |
| | | | 136/244 |
| 2014/0166067 A1 | 6/2014 | McGlynn et al. | |
| 2014/0338745 A1 | 11/2014 | Yoshimine et al. | |
| 2015/0287860 A1 | 10/2015 | Tsukada et al. | |
| 2016/0284907 A1 * | 9/2016 | Inaba | .................. H01L 31/0488 |
| 2018/0337296 A1 * | 11/2018 | Streett | ................. H01L 31/0481 |

OTHER PUBLICATIONS

Search Report and Opinion dated Apr. 16, 2018 for European patent application No. 17205573.3, 7 pgs.

* cited by examiner

*Primary Examiner* — Daniel P Malley, Jr.

(57) ABSTRACT

Methods of fabricating a solar cell assembly for streamlined bodies are provided. The solar cell assembly may be prepared on an assembly fixture. The solar cell assembly may then be removed from the assembly fixture and positioned on a top surface of the streamlined body. In examples, the solar cell assembly comprises a first film, an array of solar cells on top of the first film, and a second silicone film deposited over the solar cells.

12 Claims, 9 Drawing Sheets

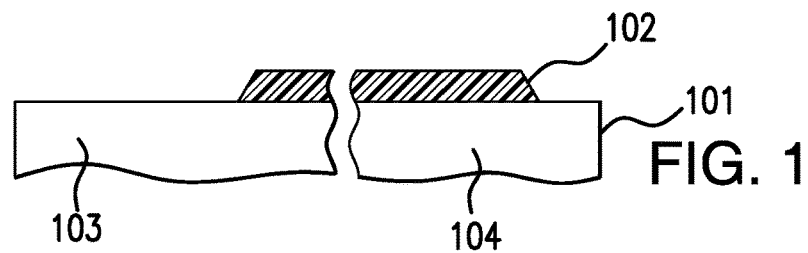
FIG. 1
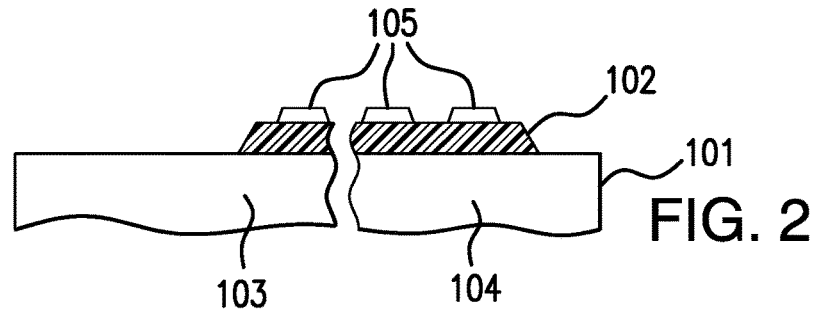
FIG. 2
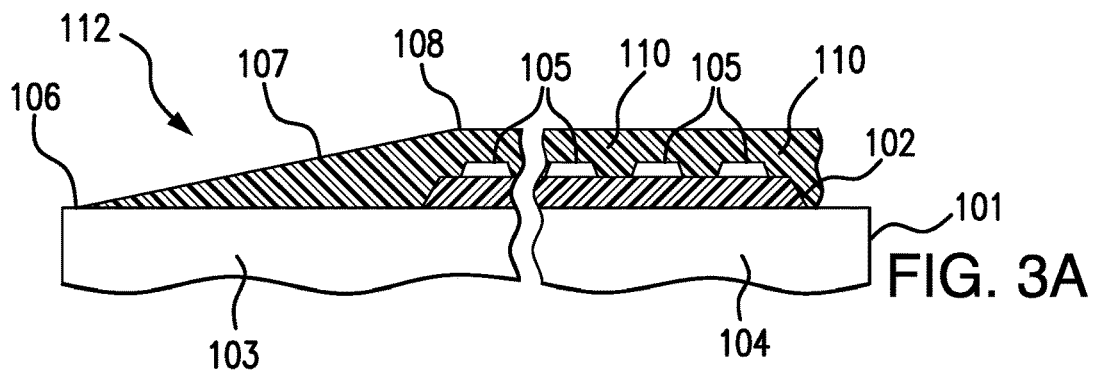
FIG. 3A
FIG. 3B
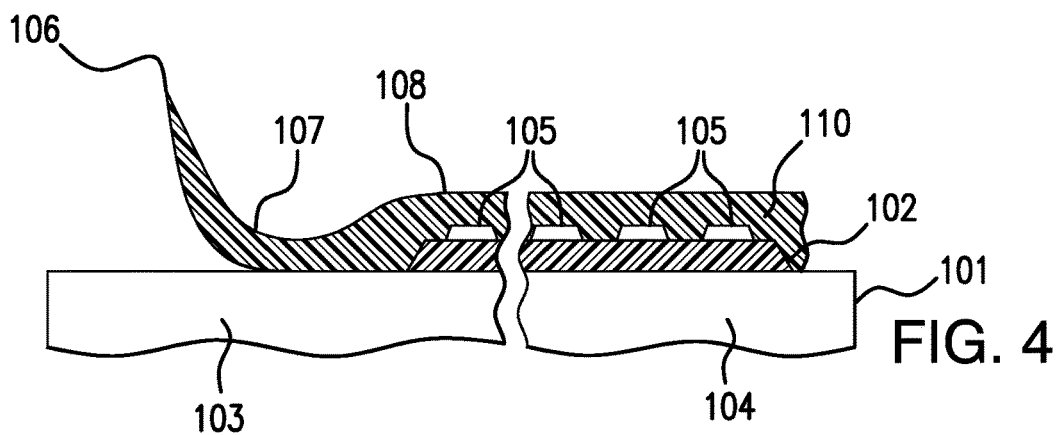
FIG. 4

LAMINAR AIRFOIL AND THE ASSEMBLY AND MOUNTING OF SOLAR CELL ARRAYS ON SUCH AIRFOILS

REFERENCE TO RELATED APPLICATIONS

This application is related to U.S. patent application Ser. No. 15/359,814 filed Nov. 23, 2016.

BACKGROUND OF THE DISCLOSURE

1. Field of the Disclosure

The present disclosure relates to arrays of solar cells arranged on streamlined bodies of vehicles. The present disclosure particularly relates to the field of laminar airfoils, and photovoltaic solar arrays mounted on such airfoils, and more particularly to fabrication processes utilizing, for example, interconnected multijunction solar cells based on III-V semiconductor compounds mounted on a film and adhered to the airfoil structure while preserving its laminar surface.

2. Description of the Related Art

Solar power from photovoltaic cells, also called solar cells, has been predominantly provided by silicon semiconductor technology. In the past several years, however, high-volume manufacturing of III-V compound semiconductor multijunction solar cells for space applications has accelerated the development of such technology not only for use in space but also for terrestrial solar power applications. Compared to silicon, III-V compound semiconductor multijunction devices have greater energy conversion efficiencies and generally more radiation resistance, although they tend to be more complex to manufacture. Typical commercial III-V compound semiconductor multijunction solar cells have energy efficiencies that exceed 27% under one sun, air mass 0 (AM0), illumination, whereas even the most efficient silicon technologies generally reach only about 18% efficiency under comparable conditions. The higher conversion efficiency of III-V compound semiconductor solar cells compared to silicon solar cells is in part based on the ability to achieve spectral splitting of the incident radiation through the use of a plurality of photovoltaic regions with different band gap energies, and accumulating the current from each of the regions.

Solar panels are generally formed by arranging a large number of solar cells in an array. Individual solar cells, frequently with a rectangular or generally square-shape and sometimes with cropped corners, are connected in electrical series to form a string of solar cells, whereby the number of solar cells used in the string determines the output voltage. Individual solar cells, or strings of solar cells, can also be interconnected in parallel, so as to increase the output current of the array. The individual solar cells are provided with electrical interconnects which facilitate the series or parallel connection of cells to form an array.

Solar cells typically have a thickness of from 0.003 to 0.006 inches (0.0762 mm to 0.1524 mm). The placement of such solar cells, or encapsulated films incorporating such solar cells, on the surface of an airfoil results in a "step" or discontinuity of the surface of the airfoil which prevents the laminar flow of air over the airfoil surface, thereby substantially decreasing the aircraft's performance and making such placement as impractical.

There is a continuing need for improved methods of manufacturing and assembling photovoltaic solar arrays that can result in a smoother top surface that will permit laminar air flow there over, as well as decreases in cost and/or increases in performance. Accordingly, the present disclosure provides improved methods of manufacturing and assembling photovoltaic solar arrays on an airfoil for an aircraft wing that requires a highly smooth surface to achieve laminar air flow for an aircraft wing or other surface that can result in increased aerodynamic performance.

SUMMARY OF THE INVENTION

1. Objects of the Disclosure

It is an object of the present disclosure to provide a process for producing solar cell array sheets for aerospace applications.

It is another object of the disclosure to provide a method for making a solar cell array sheet with an extremely smooth outer surface suitable for use on laminar airfoils.

Some implementations of the present disclosure may incorporate or implement fewer of the aspects and features noted in the foregoing objects.

2. Features of the Disclosure

All ranges of numerical parameters set forth in this disclosure are to be understood to encompass any and all subranges or "intermediate generalizations" subsumed therein. For example, a stated range of "1.0 to 2.0 microns" for a value of a dimension of a component such as its thickness should be considered to include any and all subranges beginning with a minimum value of 1.0 microns or more and ending with a maximum value of 2.0 microns or less, e.g., 1.0 to 1.2, or 1.3 to 1.4, or 1.5 to 1.9 microns.

In a first aspect, the present disclosure provides a method of fabricating a solar cell array for a substantially streamlined body. The method comprises providing an assembly fixture having a substantially smooth planar surface and constructing a solar cell assembly on the smooth planar surface. Constructing the solar cell assembly comprises depositing a first silicone film directly on the planar surface of the fixture, mounting an array of interconnected solar cells having a front light receiving side and a back side, with the back side disposed directly over the first adhesive film and depositing a second silicone film comprising a first portion tapering in thickness and comprising a second portion of the second film directly over the front side of the solar cells so as to encapsulate the solar cells and provide a smooth surface allowing laminar flow there over.

According to this aspect, a solar cell assembly is first arranged on a smooth planar surface of the assembly fixture, which facilitates the manufacture of the assembly. Afterwards, this same assembly may be removed from the assembly fixture and positioned on a streamlined body, e.g. a wing of an aircraft, or a portion of a watercraft or a land vehicle.

The solar cell assembly has a first tapering portion. When the solar cell assembly is positioned on the streamlined body, laminar air flow may be maintained around the streamlined body, since the air (or other fluid) flow does not encounter any bumps or sudden curvature changes, which can provoke a flow to become turbulent or can provoke flow separation. A laminar air flow around a body can lead to less drag or resistance, and can lead to more lift (in the case of e.g. an airfoil). A turbulent flow, or a wake (this occurs when a boundary layer become detached form a body, i.e. flow separation) can lead to a significant increase in drag, and potentially to a loss of lift. The thickness of the solar cell assembly in the area where the solar cells are arranged may be substantially constant.

A streamlined body as used herein shall be understood to mean a body having a shape aimed at maintaining a substantially laminar fluid flow around the body. In the case of air flow, such a streamlined shape may sometimes be called, an "aerodynamic" or aerodynamically efficient shape.

In a further aspect, the present disclosure provides a method of fabricating a solar cell array on the surface of an airfoil comprising: providing an assembly fixture having a smooth, planar surface; depositing a first silicone film having a first portion and a second portion adjacent to the first portion directly on the surface of the fixture; mounting an array of interconnected solar cells having a front or light receiving side and a back side, with the backside disposed directly over the first silicone film on the second portion thereof; depositing a second silicone film tapering in thickness from 0.000 to 0.020 inches over the first portion of the silicone film and continuing over the second portion of the silicone film at a constant thickness directly over the top side of the solar cells so as to encapsulate the solar cells and provide a smooth surface allowing laminar flow there over.

In yet a further aspect, the present disclosure provides a method of applying and bonding a solar cell array to an airfoil comprising: providing a laminar flow airfoil having a top surface with a leading edge; providing a double sided adhesive film and positioning it on the top surface of the airfoil; bonding the bottom surface of the adhesive film to the surface of the airfoil; and positioning a silicone film including a solar cell array over the top surface of the adhesive film; and bonding the film to the top surface of the adhesive film on the top surface of the airfoil starting with a first point adjacent to the leading edge and proceeding towards the trailing edge to a point on the upper surface of the airfoil.

In yet another aspect, the present disclosure provides a method of fabricating a solar cell array laminate subassembly for mounting on an airfoil by providing an assembly fixture having a smooth, planar surface; mounting a film composed of a non-crosslinked silicone film layer directly on the planar surface; and mounting an array of interconnected solar cells directly over one portion of the film layer depositing a tapered silicone film over the silicone film layer and adjacent thereto a constant thickness silicone film over the interconnected solar cells; and mounting a film composed of ethylene tetrafluoroethylene (ETFE) directly on the surface of the silicone film.

And in yet a further aspect, the present disclosure provides a vehicle comprising a streamlined body, the streamlined body comprising a top surface, wherein a solar cell assembly is mounted on the top surface. The solar cell assembly comprises a first silicone film, an array of interconnected solar cells having a front light receiving side and a back side, with the back side disposed directly over the first film, and further comprises a second silicone film comprising a first portion tapering in thickness and comprising a second portion of the second film at a constant thickness directly over the front side of the solar cells so as to encapsulate the solar cells and provide a smooth surface allowing laminar flow there over.

In some embodiments, a plurality of solar cells are disposed closely adjacent to one another on each of the strips by a distance between 5 and 25 microns.

In some embodiments, each of the solar cells have a dimension in the range of 0.5 to 10 mm on a side.

In some embodiments comprising an ETFE film on top of the silicone encapsulating the solar cells, the ETFE film has a thickness between 0.001 and 0.020 inches (between 0.0254 mm and 0.508 mm).

In some embodiments of the disclosure, the back side support of the solar cell assembly is a polymide film layer such as KAPTON. KAPTON® is a trademark of E.I. du Pont de Nemours and Company. The chemical name for KAPTON® is poly (4,4'-oxydiphenylene-pyromellitimide). Other polymide film sheets or layers may also be used.

In some embodiments, the back side support has a thickness of between 25 and 100 microns, or between 1 mil (25.4 µm) and 4 mil (101.6 µm).

In some embodiments, the array of interconnected solar cells are III-V compound semiconductor multijunction solar cells.

In some embodiments, the pressure sensitive adhesive (PSA) which may be used for attaching the ETFE film is a single monomer or co-monomer silicone blend.

In some embodiments, a double-faced pressure sensitive adhesive (PSA) template or patch is positioned on the backside of the solar cell assembly for attachment to a body, particularly a streamlined body, e.g. an airfoil body. The terms pressure-sensitive adhesive and "PSA" are used interchangeably herein.

In some embodiments the airfoil includes a foam interior with a composite covering. In some embodiments, the airfoil may be rigid, such as an aluminum honeycomb frame with carbon composite face sheet, or it may be flexible, such as a polymide film.

In some embodiments, the solar cell assembly may be attached to a body by a composite film comprising a double-faced PSA and a polyimide film. The double-faced pressure-sensitive adhesive template or patch and a polyimide film may be bonded together without use of a co-curing process.

In some embodiments, the double-faced pressure-sensitive adhesive template is covered at least partially with a release liner which is removed before making the bonding with a substrate. The substrate may in particular be a streamlined body.

In some embodiments, the PSA film may be an acrylic or a silicone adhesive, or any other suitable material.

In some embodiments, the PSA film may have one or two release liners, or possibly no release liners. In some embodiments, the PSA film may have continuous release liners that are removed in one step, or it may have a multiplicity of release liners that are removed individually.

In some embodiments, the PSA film may be prepared onto a permanent flexible substrate, such as a polyimide, with a release liner or liners on the opposite side.

In some embodiments, the PSA film may be applied first to the substrate, and then the solar cells attached to the PSA film, or it may be applied first to the back of the solar cells, and then the solar cells with PSA film are applied to the substrate.

In some embodiments, if the PSA film is prepared on a permanent substrate, the solar cells or solar cell assemblies may be applied directly to the PSA film.

In some embodiments, the PSA may be a patterned layer, or it may be a continuous layer. For instance, the PSA may be patterned into the shape of solar cells.

In some embodiments, the assembly of polyimide-PSA-release liner is bonded directly to a solar array substrate by co-curing the polyimide film to the face of the solar array substrate. The solar array substrate to which the polyimide is bonded may be composite substrate, and it may have a carbon composite face sheet. It may be a rigid substrate, or it may be a flexible substrate.

In another aspect, the present disclosure provides an aircraft and its method of fabrication comprising an airfoil comprising: a carbon fiber composite face sheet forming the skin of the airfoil; a double sided adhesive film positioning on the top surface of the face sheet; and a silicone film including an array of solar cells encapsulated therein and positioned over the top surface of the adhesive film so that the film is bonded to a predefined region on the top surface of the face sheet and spaced apart from the leading edge of the airfoil wherein the film is designed to permit laminar flow over the surface of the skin of the airfoil.

Some implementations of the present disclosure may incorporate or implement fewer of the aspects and features noted in the foregoing summaries.

Additional aspects, advantages, and novel features of the present disclosure will become apparent to those skilled in the art from this disclosure, including the following detailed description as well as by practice of the disclosure. While the disclosure is described below with reference to preferred embodiments, it should be understood that the disclosure is not limited thereto. Those of ordinary skill in the art having access to the teachings herein will recognize additional applications, modifications and embodiments in other fields, which are within the scope of the disclosure as disclosed and claimed herein and with respect to which the disclosure could be of utility.

BRIEF DESCRIPTION OF THE DRAWING

To complete the description and in order to provide for a better understanding of the disclosure, a set of drawings is provided. Said drawings form an integral part of the description and illustrate embodiments of the disclosure, which should not be interpreted as restricting the scope of the disclosure, but just as examples of how the disclosure can be carried out. The drawings comprise the following figures:

FIG. 1 is a cross-sectional view of a fixture for assembling the airfoil layer with a solar cell assembly according to an example of the present disclosure after the first process step;

FIG. 2 is a cross-sectional view of the fixture of FIG. 1 after the next process step of attaching the solar cell assembly according to an example;

FIG. 3A is a cross-sectional view of the fixture of FIG. 2 after the next process step according to an example;

FIG. 3B is an enlarged cross-sectional view of the end of the airfoil layer of FIG. 3A;

FIG. 4 is a cross-sectional view of the fixture of FIG. 3A after the next process step according to an example;

DESCRIPTION OF ILLUSTRATIVE EMBODIMENTS

Figure 5A:
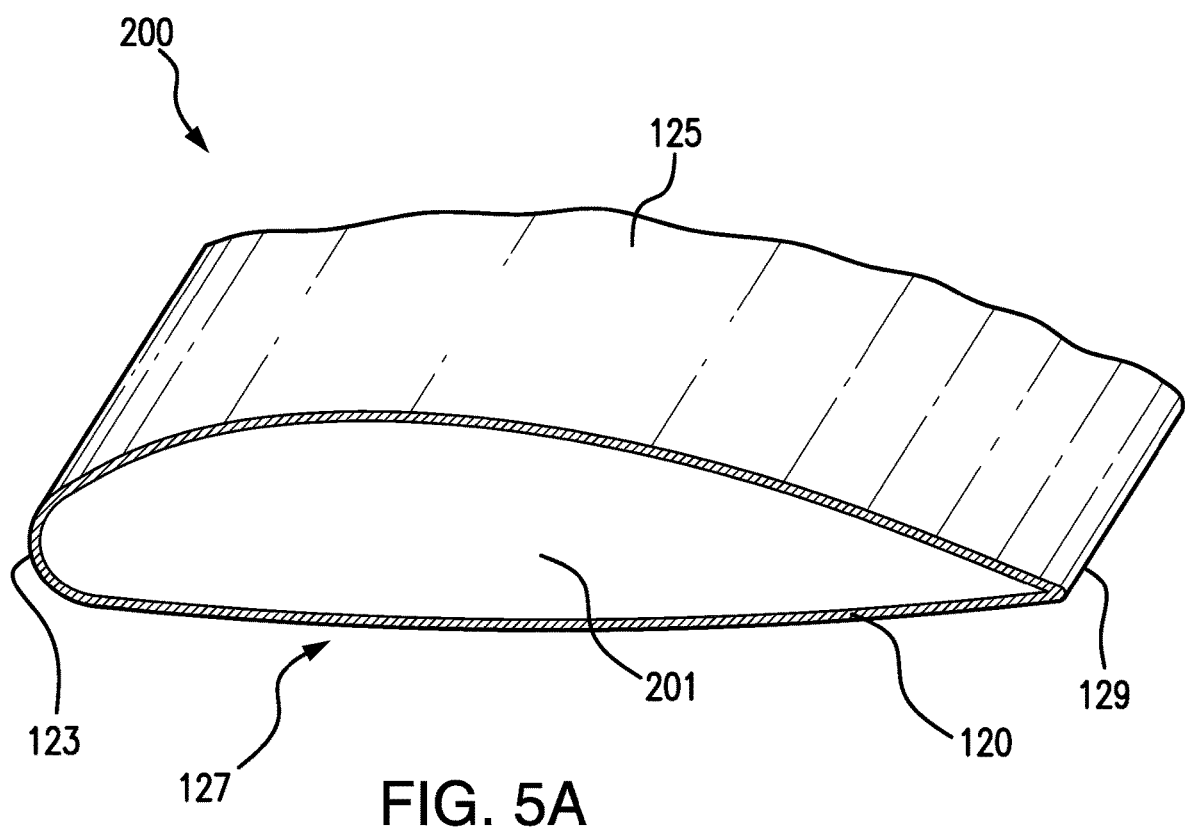
FIG. 5A is a cross-sectional view of an aircraft wing.

Details of the present invention will now be described including exemplary aspects and embodiments thereof.

Referring to the drawings and the following description, like reference numbers are used to identify like or functionally similar elements, and are intended to illustrate major features of exemplary embodiments in a highly simplified diagrammatic manner. Moreover, the drawings are not intended to depict every feature of the actual embodiment nor the relative dimensions of the depicted elements, and are not drawn to scale.

FIG. 1 is a cross-sectional view of a generally planar fixture 101 for assembling the airfoil layer with a solar cell assembly according to the present disclosure after the first process step of depositing a first silicone supporting film 102 on a first portion 104 of the fixture.

FIG. 2 is a cross-sectional view of the fixture of FIG. 1 after the next process step of attaching the solar cell assembly including a plurality of interconnected solar cells 105 on the surface of the supporting film 102. The solar cells may be connected in electrical series by means of electrical interconnects.

The electrical interconnects between adjacent solar cells are not shown in the interest of simplifying the drawing. The solar cells may have electrical contacts on the top side and the back side, or contacts on just the back side (an "all back side contact" solar cell), or contacts on just the front side.

In some embodiments, the array of solar cells is between 0.010 and 0.030 inches (between 0.254 mm and 0.762 mm) in thickness, and includes a serially interconnected string of solar cells of a III-V compound semiconductor material.

FIG. 3A is a cross-sectional view of the fixture of FIG. 2 after the next process step of the same example. The next step in this example comprises depositing a second silicone film 112 over the second portion 103 of the fixture 101, and continuing over the solar cells 105 and the first silicone film 102. A first portion 107 of the second silicone film 112 tapers in thickness from 0.000 to 0.020 inches (from 0 to 0.508 mm). The first portion of the second silicone film, as may be seen in FIG. 3A, may be deposited directly on the assembly fixture (i.e. not on the first silicone film, and not on the solar cells). The second silicone film 112 comprises a second portion 110 at a constant thickness directly over the top side of the solar cells so as to encapsulate the solar cells and provide a smooth surface allowing laminar flow there over. Reference sign 108 indicates an intermediate portion of the second silicone film covering the first silicone film (but no solar cell) between the first tapering portion 107 and the second portion 110 of the second silicone film.

The tapering of the first portion 107 is preferably no more than a gradation of two degrees in the steepness of the second silicone film. Stated another way, since the tangent of two degrees is 0.035, there can be an increase in thickness of the second portion of the silicone film by no more than 3.5 cm for each 100 cm in length of the film (using metric measurements).

The thickness of the second portion of the silicone film is between 0.020 and 0.040 inches (0.508 mm to 1.016 mm) in thickness, and the thickness of the array of solar cells is between 0.003 and 0.008 inches (between 0.0762 mm and 0.2032 mm) in thickness.

After depositing the second silicone film, the first and second silicone films can merge together to form a single silicone layer encapsulating the solar cells.

Turning to FIG. 3B, in some embodiments, an ETFE film or layer 114 between 0.001 and 0.020 inches (between 0.0254 mm and 0.508 mm) in thickness may be attached or deposited on the top surface of the second silicone film 112. In some embodiments, a double sided pressure sensitive adhesive (PSA) film 113 may be applied to the top surface of the second silicone film 112, and the ETFE film or layer 114 mounted on the top surface of the PSA film 113. The resulting laminate structure will be referred to hereafter as a "solar cell assembly".

FIG. 4 is a cross-sectional view of the fixture of FIG. 3 after the next process step in which the solar cell assembly is peeled or detached from the fixture 101 starting with the end point 106.

FIG. 5A is a cross-sectional and perspective view of a wing airfoil 200 on which an solar cell assembly according to the present disclosure may be mounted. The airfoil comprises a suction side 125 and a pressure side 127, and extends between a leading edge 123 and a trailing edge 129. The airfoil includes an interior portion 201, which may be a supporting foam material, and a skin 120. In other examples, the airfoil body may include a different interior structure including e.g. one or more spars or a spar box.

Figure 5B:
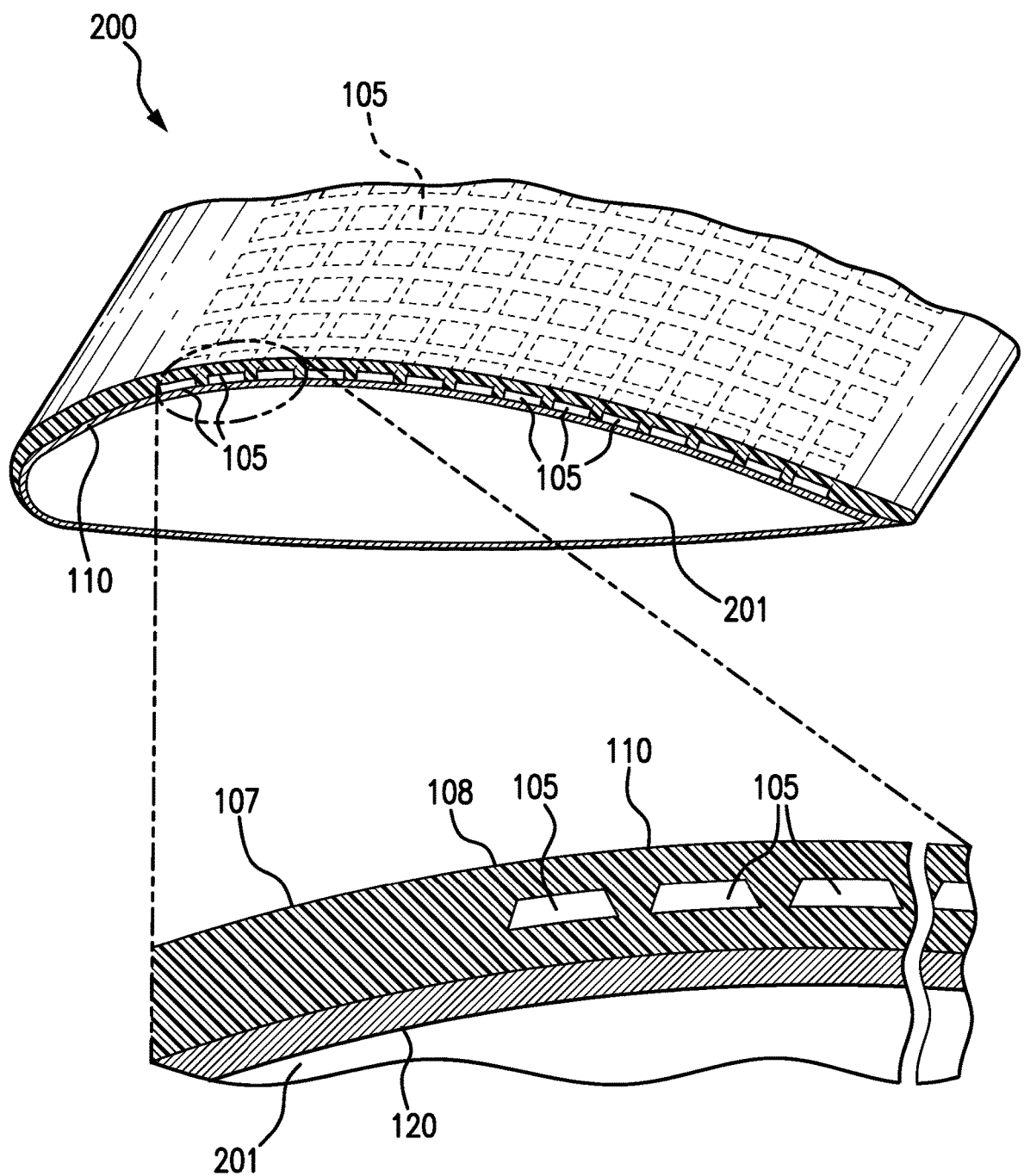
FIG. 5B is a cross-sectional view of the airfoil layer of FIG. 4 after the next process step of mounting it on the top surface of a wing airfoil.

FIG. 5B is a cross-sectional view of the wing airfoil of FIG. 5A after the next process step of mounting the solar cell assembly on the leading edge of a wing airfoil. The surface of the airfoil skin 120 may be metal, a carbon fiber composite or other composite material, or a combination thereof. In some embodiments, the solar cell assembly may be attached to the surface of the airfoil skin 120 with a double-sided pressure sensitive adhesive or a composite film including such an adhesive.

The upstream end point 106 of the solar cell assembly may be attached first to a point closely adjacent to the leading edge 123 of the wing, and working backwards along the top surface of the wing. At least a substantial portion of the solar cell assembly is upper surface of the wing airfoil. In use, the solar cells will thus be able to receive sun light.

In some examples, the point of attachment of the upstream end point 106 of the solar cell assembly may be on the suction side 125 of the airfoil, i.e. the entire solar cell assembly may be arranged on the suction side 125. In order to maintain a substantially laminar flow around the airfoil body, the solar cell assembly includes a tapering upstream portion, so that the flow is not suddenly disturbed.

Figure 5C:
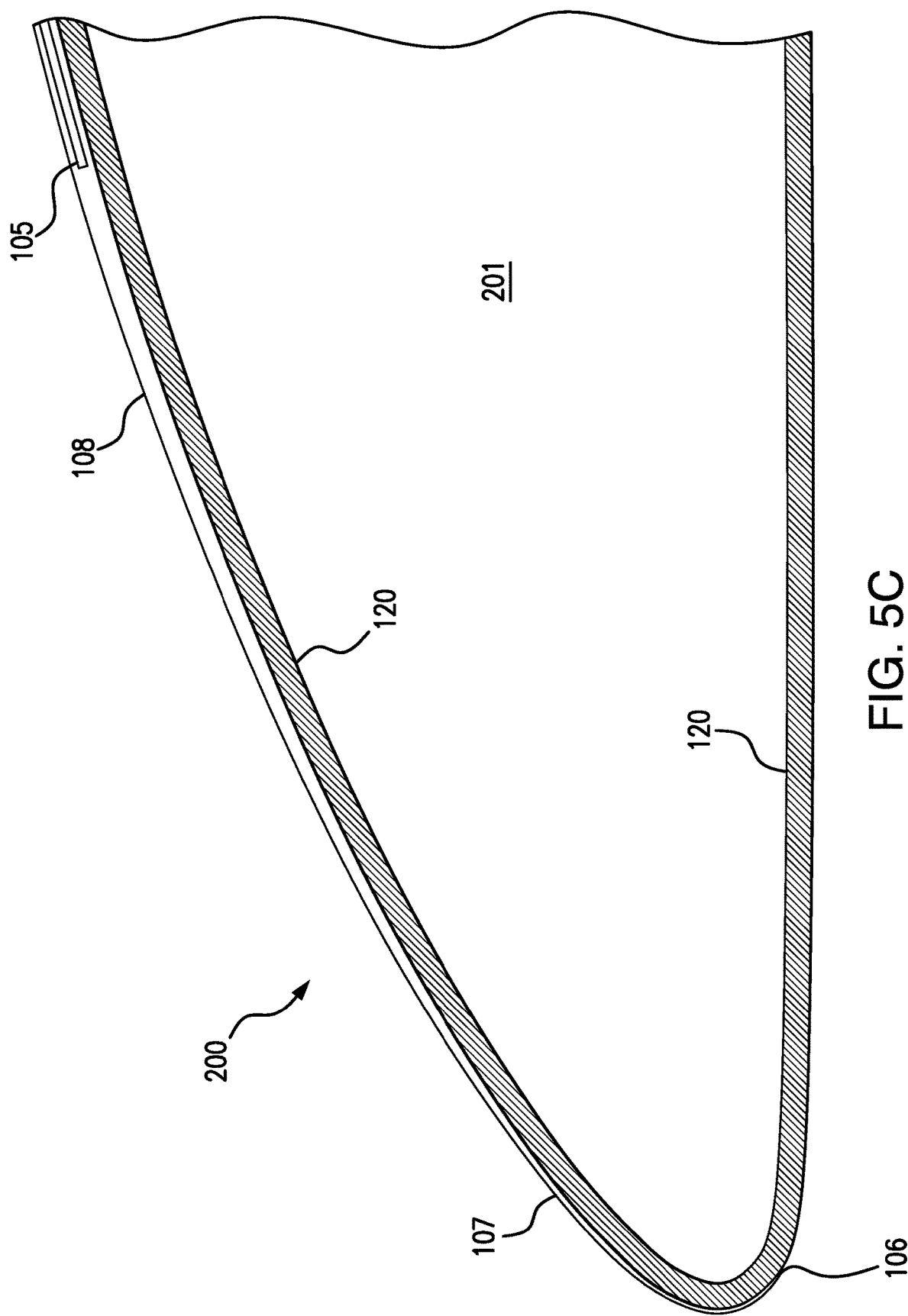
FIG. 5C is an enlarged cross-sectional view of the front portion of the wing of FIG. 5B.

In some other embodiments, the point of attachment of the upstream end point 106 may be on the bottom side of the wing (i.e. on the pressure surface 127 of the airfoil), at least 0.25 inches (6.35 mm) behind the leading edge, as illustrated in the enlarged view of FIG. 5C. At the point of attachment 106, the film may have a thickness of 0.005 inches, and consists entirely of the ETFE film layer 114.

With such an arrangement, the air flow on the suction surface may also be laminar. The air flow does not encounter any sudden curvature changes or obstacles. On the suction side of the airfoil, the thickness of the airfoil has merely been slightly increased. A transition to a turbulent flow and/or flow separation may thus be avoided.

In some embodiments, the pressure sensitive adhesive film is between 0.001 and 0.010 inches in thickness (between 25.4 microns and 250.4 microns).

In some embodiments, the solar cell assembly layer covers from 60 to 90% of the upper surface of the wing airfoil. In some embodiments, such as shown e.g. in FIG. 5B, the solar cell assembly may extend to the trailing edge 129 of the airfoil body. If the solar cell assembly does not extend completely to the trailing edge 129, it is preferable to avoid a sudden "step" on the suction side 125. The downstream portion of the solar cell assembly may also comprise a tapering portion.

FIG. 5C is an enlarged cross-sectional view of the front portion or leading edge 123 of the wing airfoil 200 depicting the solar cell assembly starting at a point 106 on the bottom surface of the wing airfoil 200, and continuing to regions 107 and 108 and thereafter to the beginning of the array of solar cells 105 in the airfoil layer.

Figure 5D:
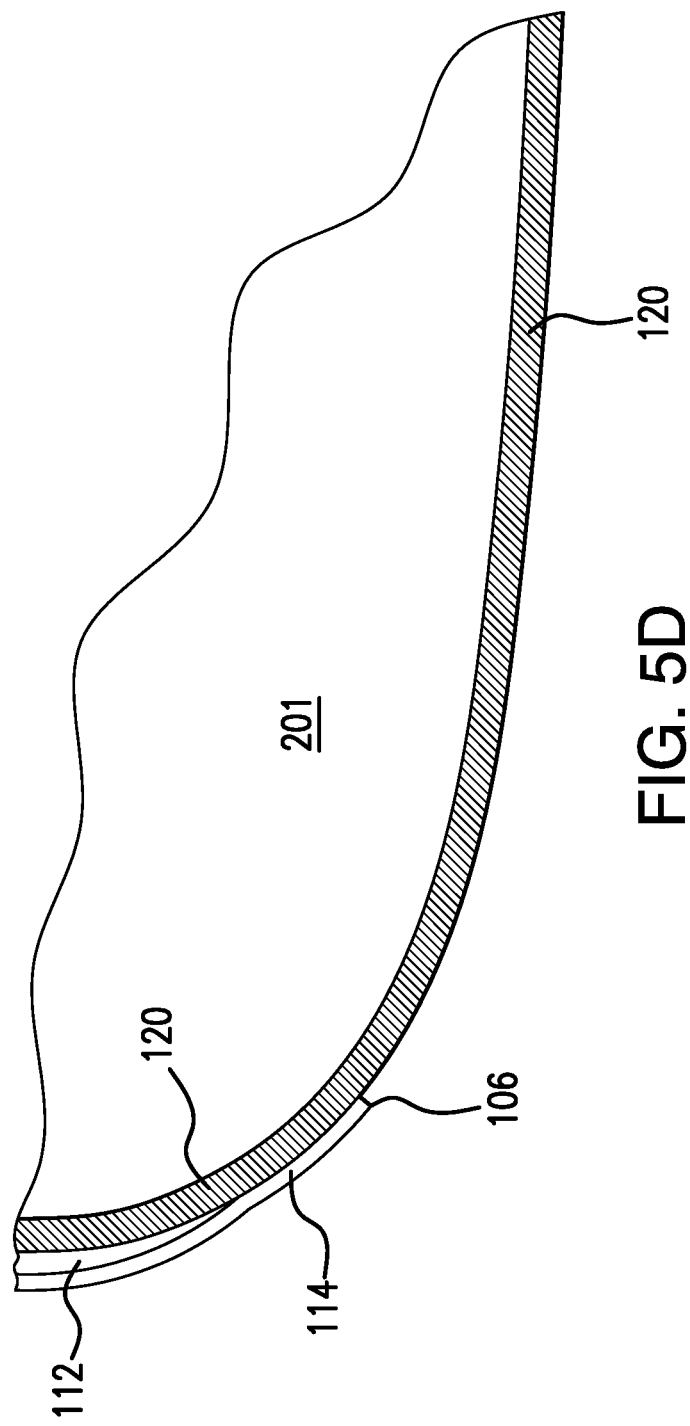
FIG. 5D is a still further enlarged cross-sectional view of the front portion of the wing of FIGS. 5B and 5C.

FIG. 5D is a still further enlarged cross-sectional view of the front portion of the wing airfoil 200 showing that in some embodiments the ETFE portion 130 of the airfoil layer extends further along the bottom surface of the wing airfoil 200 over the silicon film layer 112, which is over the airfoil skin 120 to a point 106 which is on the bottom side of the wing airfoil 200.

In addition to a wing airfoil, or other exposed surfaces of an aircraft, the present technique may be used to mount solar cells on the non-planar surface of a variety of different vehicles such as watercraft and land vehicles, or other structures (e.g., building materials), as will be illustrated in subsequent Figures. When mounting solar cells to streamlined bodies, the (laminar) air flow around such a body could be disturbed, leading to more resistance and decreased performance. This can be avoided with the examples of the present disclosure.

Exemplary aircraft having non-planar surfaces include aerostats (which are lighter than air), and aerodynes (which are heavier than air). Exemplary aerostats can include, for example, unpowered vessels (e.g., balloons such as hot air balloons, helium balloons, and hydrogen balloons) and powered vessels (e.g., airships or dirigibles). Exemplary aerodynes can include, for example, unpowered vessels (e.g., kites and gliders) and powered vessels (e.g., airplanes and helicopters). Exemplary aerodynes can be fixed wing vessels (e.g., airplanes and gliders) or rotorcraft (e.g., helicopters and autogyros).

Exemplary watercraft having non-planar surfaces can be motorized or non-motorized, and can be propelled or tethered. Exemplary watercraft can include surface vessels (e.g., ships, boats, and hovercraft) and submersible vessels (e.g., submarines and underwater flotation vessels).

Exemplary land vehicles having non-planar surfaces can be motorized (e.g., automobiles, trucks, buses, motorcycles, rovers, and trains) or non-motorized (e.g., bicycles).

Figure 6:
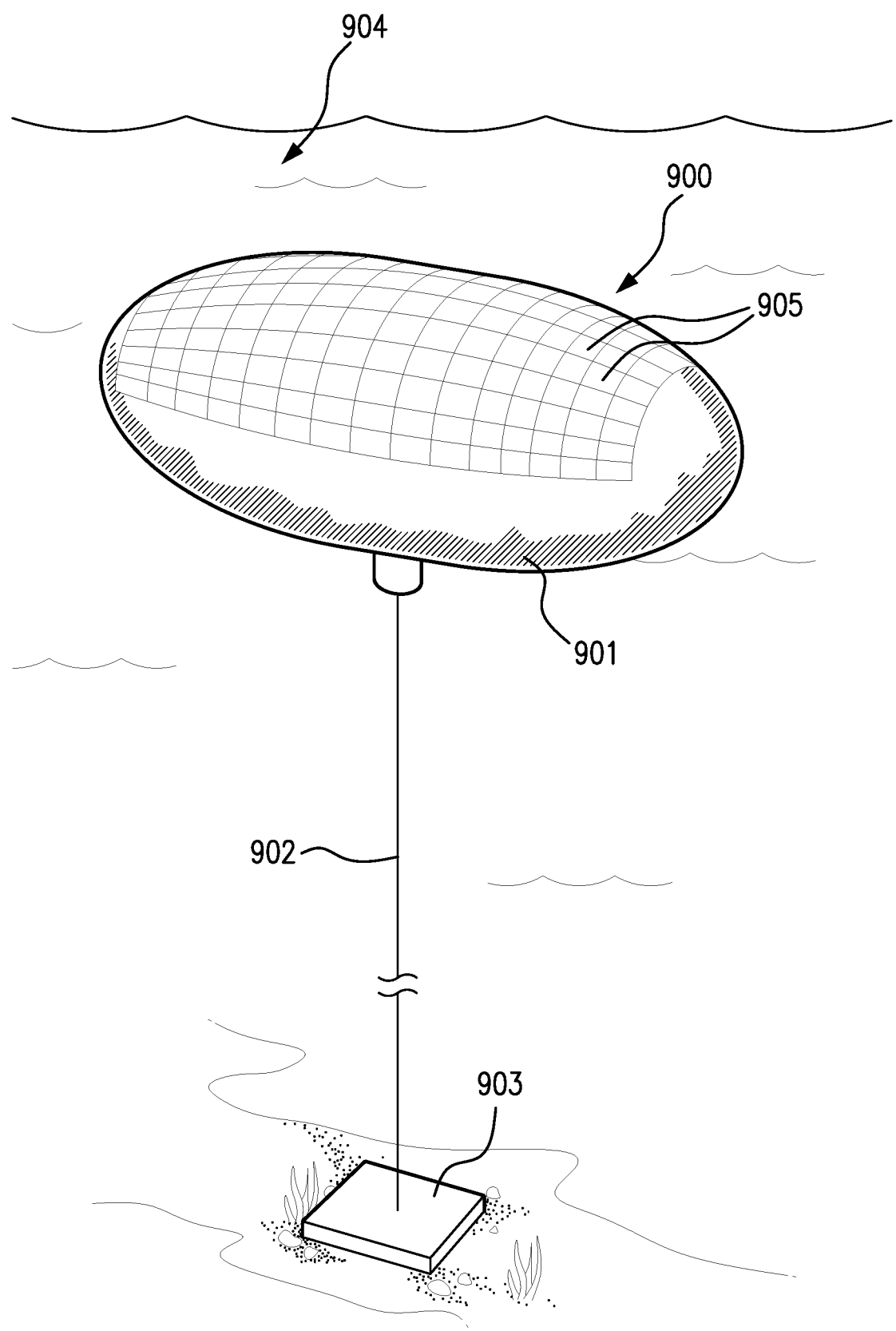
FIG. 6 is a perspective view of an exemplary embodiment of a watercraft having a solar assembly, according to the present disclosure, attached to a non-planar surface of the watercraft.

FIG. 6 is a perspective view of an exemplary embodiment of a watercraft. A submersible watercraft 904 has a non-planar surface and is attached to platform 903 via tether 902. Submersible watercraft 904 includes the underwater flotation vessel 901 that is held at a desired depth below the water surface by controlling the length of the tether 902. The solar cell assembly 900 is attached to a non-planar surface of the underwater flotation vessel 901. The solar cell assembly 900 in this example includes an array of solar cells 905. In certain embodiments, when light impinges on the solar cell assembly 900 of submersible watercraft 904, electrical current generated from the solar cell assembly 900 can be provided to platform 903 via the tether 902. The solar cell assembly 900 attached to watercraft 904 may be manufactured in accordance with any of the examples disclosed herein. The water flow around the watercraft can thus be substantially unaffected.

Figure 7:
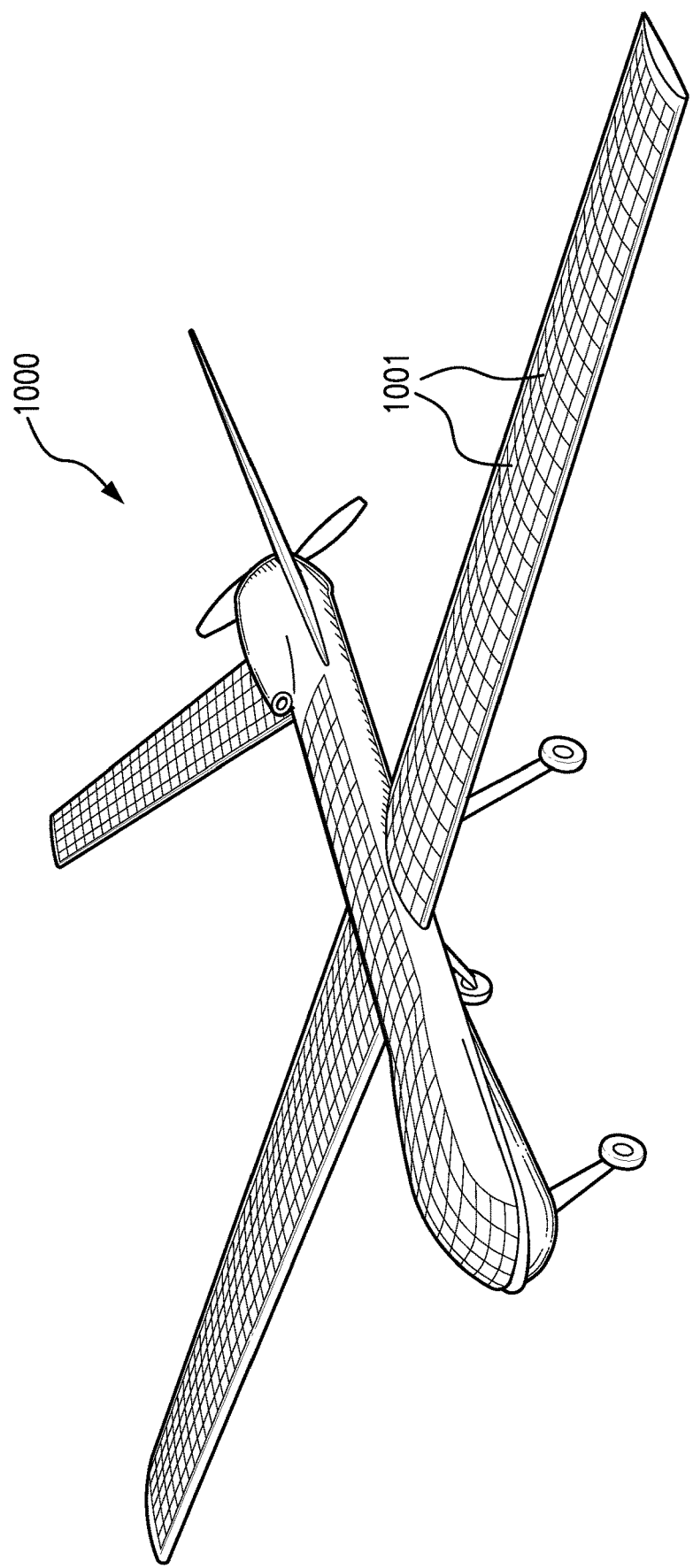
FIG. 7 is a perspective view of an exemplary embodiment of an aircraft having a solar assembly, according to the present disclosure, attached to different, non-planar surfaces of the aircraft.

FIG. 7 is a perspective view of an exemplary embodiment of an unmanned aircraft. Aircraft 1000 has non-planar surfaces and is a fixed wing vessel. The solar cell assembly 1001 may be attached to a plurality of non-planar surfaces of the aircraft 1000, including one or more of the suction surfaces of the wings and horizontal tail surface, and the top surface of the fuselage. In certain embodiments, when light impinges on the solar cell assembly 1001 of aircraft 1000, electrical current generated from the solar cell assembly

1001 can be provided for operation of systems (e.g., navigational systems, propulsion systems, and the like) of aircraft 1000.

Figure 8:
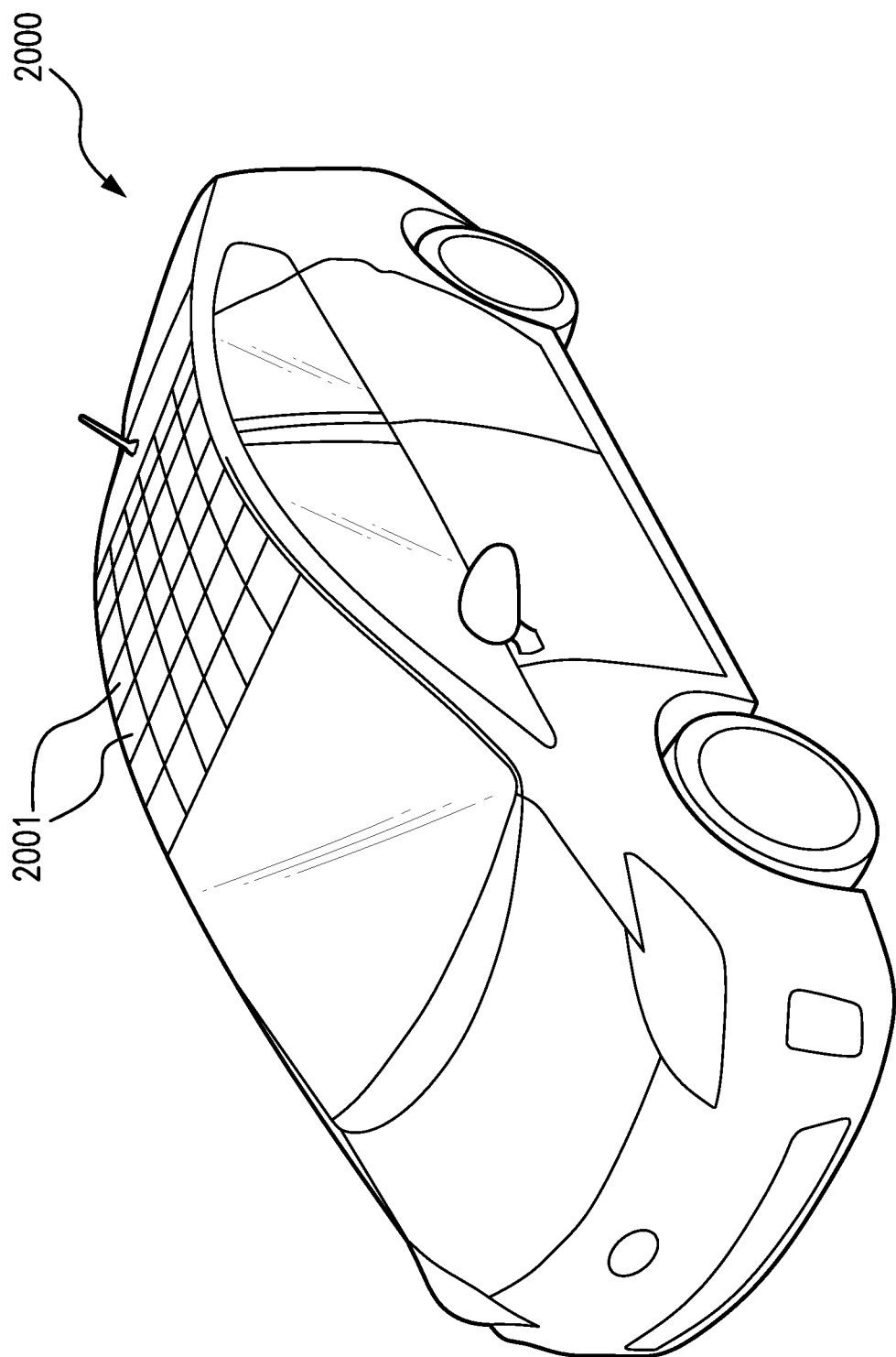
FIGS. 8 and 9 are perspective views of exemplary embodiments of land vehicles having solar assemblies, according to the present disclosure, attached to surfaces of the land vehicles.

FIG. 8 is a perspective view of an exemplary embodiment of a land vehicle. Land vehicle 2000 has a non-planar top surface and is an automobile. The solar cell assembly 2001 is attached to a non-planar surface of an automobile 2000. In certain embodiments, when light impinges on the solar cell assembly 2001 of automobile 2000, electrical current generated from solar cell assembly 2001 can be provided for operation systems (e.g., navigational systems, propulsion systems, and the like) of automobile 2000. In certain embodiments, automobile 2000 is a hybrid or electric powered automobile. Using any of the examples of solar cell assemblies disclosed herein, the resistance of the automobile remains the same (or almost the same) as if the solar cell assemblies were not incorporated.

Figure 9:
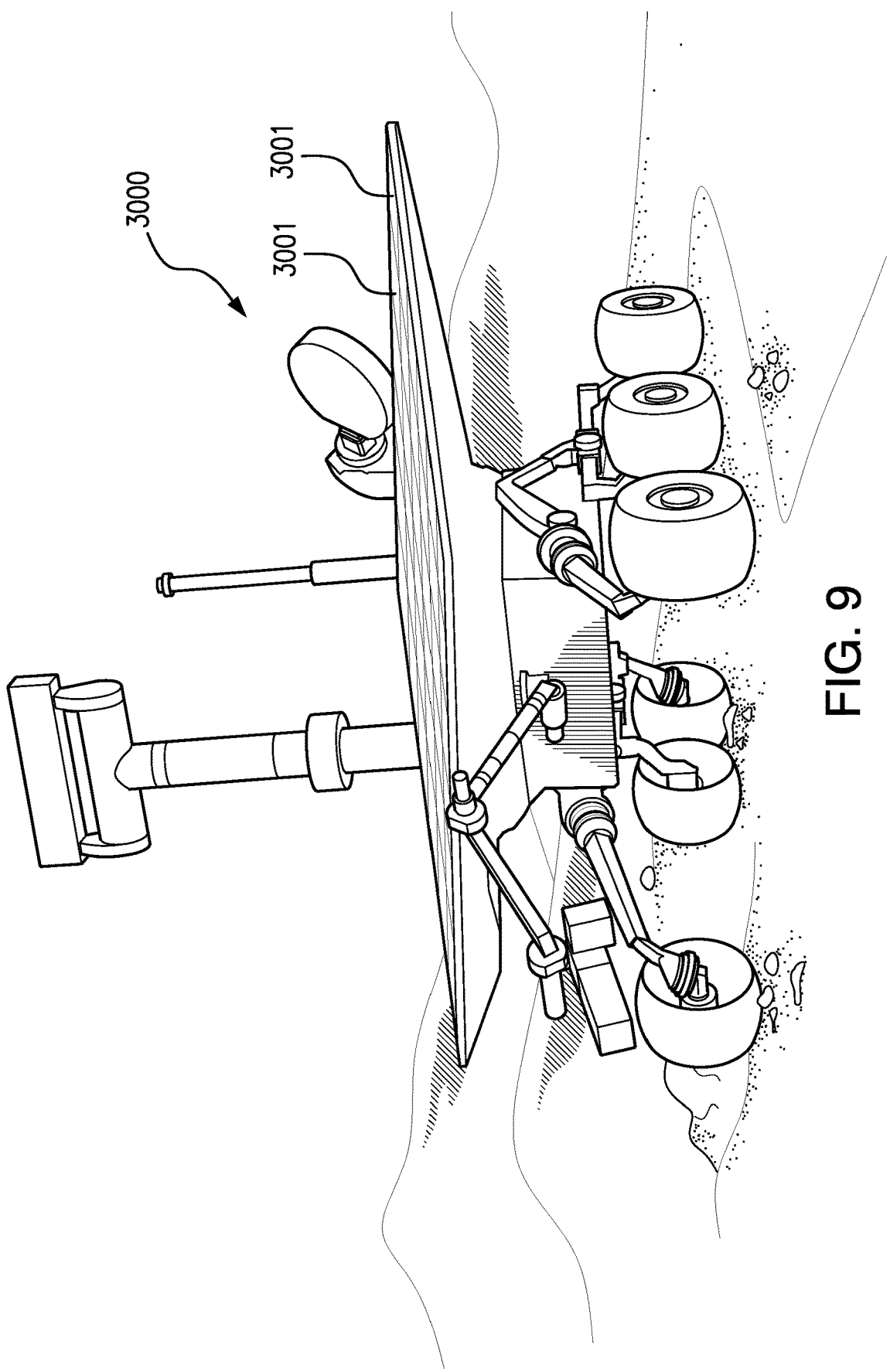

FIG. 9 is a perspective view of another exemplary embodiment of a land vehicle. Land vehicle 3000 has a non-planar surface and is a rover that can be used for land navigation and/or exploration on earth or other planets. The solar cell assembly 3001 is attached to a non-planar surface of the rover 3000. In certain embodiments, when light impinges on the solar cell assembly 3001 of rover 3000, electrical current generated from solar cell assembly 3001 can be provided for operation of systems (e.g., navigational systems, propulsion systems, and the like) of rover 3000. In certain embodiments, rover 3000 is a hybrid or electric powered land vehicle.

Although this disclosure has been described in certain specific embodiments, many additional modifications and variations would be apparent to those skilled in the art. The present disclosure is therefore considered in all respects to be illustrative and not restrictive. The scope of the disclosure is indicated by the appended claims, and all changes that come within the meaning and range of equivalents thereof are intended to be embraced therein.

It will be understood that each of the elements described above, or two or more together, also may find a useful application in other types of constructions differing from the types described above.

It is to be noted that the terms "front", "back", "top", "bottom", "over", "on", "under", and the like in the description and in the claims, if any, are used for descriptive purposes and not necessarily for describing permanent relative positions. It is understood that the terms so used are interchangeable under appropriate circumstances such that the embodiments of the disclosure described herein are, for example, capable of operation in other orientations than those illustrated or otherwise described herein.

For reasons of completeness, various embodiments are set out in the following numbered clauses.

Clause 1. A method of fabricating a solar cell array on the surface of an airfoil comprising:

providing an assembly fixture having a smooth, planar surface;

depositing a first silicone film having a first portion and a second portion adjacent to the first portion directly on the surface of the fixture;

mounting an array of interconnected solar cells having a front or light receiving side and a back side, with the backside disposed directly over the first silicone film on the second portion thereof;

depositing a second silicone film tapering in thickness from 0.000 to 0.020 inches over the first portion of the first silicone film and continuing over the second portion of the first silicone film at a constant thickness directly over the top side of the solar cells so as to encapsulate the solar cells and provide a smooth surface allowing laminar flow there over.

Clause 2. A method as defined in clause 1, wherein thickness of the second portion of the silicone film is between 0.020 and 0.040 inches in thickness.

Clause 3. A method as defined in clause 1, wherein the thickness of the array of solar cells is between 0.003 and 0.008 inches in thickness.

Clause 4. A method as defined in clause 1, further comprising adhering a film of ETFE material between 0.001 and 0.020 inches in thickness over the silicone film.

Clause 5. A method as defined in clause 4, wherein the step of adhering a ETFE film utilizes a pressure sensitive adhesive film of 0.001 inches in thickness.

Clause 6. A method as defined in clause 1, further comprising adhering a film composed of a poly (4,4'-oxydiphenylene-pyromellitimide) material and having a thickness of 0.001 inches to the bottom of the silicone film.

Clause 7. A method as defined in clause 1, wherein the thickness of the first portion of the first silicone film begins at the edge of the first portion at a thickness of between 0.003 and 0.005 inches and tapers in a direction away from the edge to a thickness between 0.020 and 0.040 inches.

Clause 8. A method as defined in clause 1, wherein the array of interconnected solar cells are III-V compound semiconductor multijunction solar cells.

Clause 9. A method as defined in clause 6, further comprising adhering the silicone film to the surface of an airfoil such that the first portion is disposed adjacent to the leading edge of the airfoil, and the second portion over the upper surface of the airfoil.

Clause 10. A method as defined in clause 9, wherein the first portion is adhered to the airfoil surface prior to mounting the second portion on the airfoil.

Clause 11. A method as defined in clause 4, wherein the adhering of the silicone film to the ETFE film utilizes a pressure sensitive adhesive composed of a single monomer or co-monomer silicone blend.

Clause 12. A method of applying and bonding a solar cell array to an airfoil comprising:

providing a laminar flow airfoil having a top surface with a leading edge;

providing a double sided adhesive film and positioning it on the top surface of the airfoil;

bonding the bottom surface of the adhesive film to the to the bottom surface of the airfoil; and positioning a silicone film including a solar cell array over the top surface of the adhesive film; and bonding the film to the top surface of the adhesive film on the top surface of the airfoil starting with a point spaced apart from the leading edge and proceeding towards a point spaced apart from the trailing edge.

Clause 13. A method as defined in clause 12, further comprising attaching a bottom layer film composed of a poly (4'4-oxysiphenylene-pyromellitimide) material to the silicone film.

Clause 14. A method as defined in claim 13, wherein the top surface of the airfoil includes a carbon fiber composite material.

Clause 15. A method as defined in clause 12, wherein the solar cell array includes a serial interconnection of III-V compound semiconductor multijunction solar cells.

Clause 16. A method as defined in clause 12, wherein the upper surface of the silicone film has a surface smoothness measured by an increase in thickness of the film over its length of no more than 3.5 cm for each 100 cm in length of the film.

Clause 17. A method as defined in clause 16, wherein the silicone film mounted on the leading edge has a thickness starting at a value in the range of 0.003 to 0.005 inches and tapers to a portion with a constant thickness in the range of 0.02 to 0.04 inches away from the leading edge, and further includes an ETFE film layer having a thickness in the range of 0.001 to 0.020 inches disposed over the silicone film.

Clause 18. A method as defined in clause 12, wherein the adhesive film is a single monomer or co-monomer blend.

Clause 19. A method as defined in clause 12, wherein the silicone film includes an ETFE layer film over the top surface thereof having a thickness of 0.001 inches.

Clause 20. An airfoil comprising:
a carbon fiber composite face sheet forming the skin of the airfoil;
a double sided adhesive film positioned on the top surface of the face sheet; and
a silicone film including an array of solar cells encapsulated therein and positioned over the top surface of the adhesive film so that the film is bonded to a predefined region on the top surface of the face sheet and spaced apart from the leading edge of the airfoil wherein the film is designed to permit laminar flow over the surface of the skin of the airfoil.

Clause 21. A method of fabricating a solar cell array for a substantially streamlined body comprising:
providing an assembly fixture having a substantially smooth planar surface; and
constructing a solar cell assembly on the smooth planar surface, wherein constructing the solar cell assembly comprises:
depositing a first silicone film directly on the planar surface of the fixture;
mounting an array of interconnected solar cells having a front light receiving side and a back side, with the back side disposed directly over the first silicone film
depositing a second silicone film comprising a first portion tapering in thickness and comprising a second portion directly over the front side of the solar cells so as to encapsulate the solar cells and provide a smooth surface allowing laminar flow there over.

Clause 22. The method according to clause 21, further comprising removing the solar cell assembly from the assembly fixture and attaching the solar cell assembly on a top surface of the streamlined body.

Clause 23. The method according to clause 22, wherein the streamlined body comprises an airfoil body, and at least a portion of the solar cell assembly is attached to a suction surface of the airfoil body.

Clause 24. The method according to clause 23, wherein the first portion is disposed adjacent to a leading edge of the airfoil body.

Clause 25. The method according to clauses 23 or 24, wherein the first portion is adhered to the airfoil body prior to mounting the second portion on the airfoil.

Clause 26. The method according to any of clauses 21-25, wherein the first portion tapers from 0.000 to 0.020 inches (0 to 0.508 mm).

Clause 27. The method according to any of clauses 21-26, wherein a thickness of the first portion of the second silicone film begins at an edge of the first portion at a thickness of between 0.003 and 0.005 inches (0.0762-0.127 mm) and tapers in a direction away from the edge to a thickness between 0.020 and 0.040 inches (0.508-1.016 mm).

Clause 28. The method according to any of clauses 21-27, wherein the tapering of the second silicone film is no more than a gradation of two degrees in the steepness.

Clause 29. The method according to any of clauses 21-28, further comprising adhering a film of ETFE material of between 0.001 and 0.020 inches (0.0254-0.508 mm) in thickness over the second silicone film (112).

Clause 30. The method of clause 29, wherein the step of adhering a ETFE film utilizes a pressure sensitive adhesive film, optionally of 0.001 inches (0.0254 mm) in thickness.

Clause 31. A vehicle comprising:
a streamlined body having a top surface,
a double sided adhesive film positioned on the top surface of the streamlined body, and
a solar cell assembly bonded to the top surface by the double sided adhesive film, wherein the solar cell assembly comprises
a first silicone film;
an array of interconnected solar cells having a front light receiving side and a back side, with the back side disposed directly over the first film;
a second silicone film comprising a first portion tapering in thickness and comprising a second portion of the second film over the front side of the solar cells so as to encapsulate the solar cells and provide a smooth surface.

Clause 32. The vehicle according to clause 31, wherein the array of interconnected solar cells are III-V compound semiconductor multijunction solar cells.

Clause 33. The vehicle according to clause 31 or 32, wherein the double sided adhesive film comprises a pressure sensitive adhesive.

Clause 34. The vehicle according to clause 33, wherein the double sided adhesive film comprises one or more release liners.

Clause 35. The vehicle according to any of clauses 31-34, wherein the first silicone film is bonded to a polyimide film.

Clause 36. The vehicle according to any of clauses 31-35, wherein the solar cell assembly further includes an ETFE film on top of the second silicone film.

Clause 37. The vehicle according to any of clauses 31-36, wherein the solar cell assembly has a substantially constant thickness in an area where the array of solar cells is arranged.

Clause 38. The vehicle according to any of clauses 31-37, wherein the vehicle is an aircraft.

Clause 39. An airfoil comprising:
a carbon fiber composite face sheet forming the skin of the airfoil;
a double sided adhesive film positioning on the top surface of the face sheet; and
a silicone film including an array of solar cells encapsulated therein and positioned over the top surface of the adhesive film so that the film is bonded to a predefined region on the top surface of the face sheet and spaced apart from the leading edge of the airfoil wherein the film is designed to permit laminar flow over the surface of the skin of the airfoil.

Clause 40. The airfoil according to clause 39, wherein the silicone extends between an upstream end point spaced apart from the leading edge and proceeding towards a downstream end point spaced apart from the trailing edge.

The present disclosure can be embodied in various ways. The above described orders of the steps for the methods are only intended to be illustrative, and the steps of the methods of the present disclosure are not limited to the above specifically described orders unless otherwise specifically stated. Note that the embodiments of the present disclosure can be freely combined with each other without departing from the spirit and scope of the disclosure.

Although some specific embodiments of the present disclosure have been demonstrated in detail with examples, it should be understood by a person skilled in the art that the above examples are only intended to be illustrative but not to limit the scope of the present disclosure. It should be understood that the above embodiments can be modified without departing from the scope and spirit of the present disclosure which are to be defined by the attached claims. Where reference signs are used in the appended claims, they should not be construed as limiting the claim in any way. The reference signs have been used only for improving the intelligibility of the claims.

The invention claimed is:

1. A method of fabricating a solar cell array for a substantially streamlined body comprising: providing an assembly fixture having a substantially smooth planar surface; and constructing a solar cell assembly on the smooth planar surface, wherein constructing the solar cell assembly comprises:
   depositing a first silicone film directly on the planar surface of the fixture;
   mounting an array of interconnected solar cells having a front light receiving side and a back side, with the back side disposed directly over the first silicone film; and
   depositing a second silicone film comprising a first portion tapering in thickness and comprising a second portion directly over the front side of the solar cells so as to encapsulate the solar cells and provide a smooth surface allowing laminar flow there over, wherein the tapering in thickness of the second silicone film is no more than a gradation of two degrees.

2. The method according to claim 1, further comprising removing the solar cell assembly from the assembly fixture and attaching the solar cell assembly on a top surface of the streamlined body.

3. The method according to claim 2, wherein the streamlined body comprises an airfoil body, and at least a portion of the solar cell assembly is attached to a suction surface of the airfoil body.

4. The method according to claim 3, wherein the first portion is disposed adjacent to a leading edge of the airfoil body.

5. The method according to claim 3, wherein the first portion is adhered to the airfoil body prior to mounting the second portion on the airfoil.

6. The method according to claim 1, wherein the first portion tapers with increasing width in a direction away from an edge of the first portion to a thickness of 0.020 inches.

7. The method according to claim 1, wherein a thickness of the first portion of the second silicone film begins at an edge of the first portion at a thickness of between 0.003 and 0.005 inches and tapers in a direction away from the edge to a thickness between 0.020 and 0.040 inches.

8. The method as defined in claim 1, further comprising adhering a film of ETFE material of between 0.001 and 0.020 inches in thickness over the second silicone film.

9. The method of claim 8, wherein the step of adhering a ETFE film utilizes a pressure sensitive adhesive film.

10. The method according to claim 1 wherein the first portion increases in thickness in a direction from an edge of the second silicone film toward the array of interconnected solar cells.

11. A method of fabricating a solar cell array for a substantially streamlined body comprising: providing an assembly fixture having a substantially smooth planar surface; and constructing a solar cell assembly on the smooth planar surface, wherein constructing the solar cell assembly comprises:
    depositing a first silicone film directly on the planar surface of the fixture;
    mounting an array of interconnected solar cells having a front light receiving side and a back side, with the back side disposed directly over the first silicone film;
    depositing a second silicone film comprising a first portion tapering in thickness and comprising a second portion directly over the front side of the solar cells so as to encapsulate the solar cells and provide a smooth surface allowing laminar flow there over; and
    removing the solar cell assembly from the assembly fixture and attaching the solar cell assembly on a top surface of the streamlined body;
    wherein the first portion is adhered to the top surface of the streamlined body prior to mounting the second portion on the streamlined body.

12. A method of fabricating a solar cell array for a substantially streamlined body comprising: providing an assembly fixture having a substantially smooth planar surface; and constructing a solar cell assembly on the smooth planar surface, wherein constructing the solar cell assembly comprises:
    depositing a first silicone film directly on the planar surface of the fixture;
    mounting an array of interconnected solar cells having a front light receiving side and a back side, with the back side disposed directly over the first silicone film; and
    depositing a second silicone film comprising a first portion tapering in thickness and comprising a second portion directly over the front side of the solar cells so as to encapsulate the solar cells and provide a smooth surface allowing laminar flow there over;
    wherein the first portion tapering in thickness is not deposited on the array of interconnected solar cells.

* * * * *